United States Patent
Shi et al.

(10) Patent No.: US 9,385,650 B2
(45) Date of Patent: Jul. 5, 2016

(54) TRANSFORMER FEEDBACK VOLTAGE CONTROLLED OSCILLATOR (VCO)

(71) Applicant: QUALCOMM Incorporated, San Diego, CA (US)

(72) Inventors: Jianlei Shi, Milpitas, CA (US); Yongwang Ding, Dublin, CA (US); Jeongsik Yang, San Jose, CA (US); Mazhareddin Taghivand, Campbell, CA (US); Sang-Oh Lee, Cupertino, CA (US); Young Gon Kim, San Jose, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 71 days.

(21) Appl. No.: 14/168,701

(22) Filed: Jan. 30, 2014

(65) Prior Publication Data

US 2015/0214891 A1     Jul. 30, 2015

(51) Int. Cl.
*H03B 5/08* (2006.01)
*H03B 5/12* (2006.01)
*H01F 27/30* (2006.01)
*H01F 17/00* (2006.01)
*H03H 7/09* (2006.01)

(52) U.S. Cl.
CPC .......... *H03B 5/1206* (2013.01); *H01F 17/0013* (2013.01); *H01F 27/30* (2013.01); *H03B 5/1212* (2013.01); *H03B 5/1228* (2013.01); *H03B 5/1296* (2013.01); *H03H 7/09* (2013.01)

(58) Field of Classification Search
CPC .. H03B 5/1228; H03B 5/1215; H03B 5/1212; H03B 5/1243; H03B 5/1296; H03L 7/099; H03L 7/18; H03L 1/00; H03L 2207/06; H03L 7/0995; H03L 1/026; H01F 17/0013; H03H 7/09
USPC .................. 336/200, 145, 146, 147; 331/167, 331/117 R, 117 FE, 36 L; 324/239; 333/167
See application file for complete search history.

(56) References Cited

U.S. PATENT DOCUMENTS

| | | | |
|---|---|---|---|
| 5,804,959 A | 9/1998 | Nakagawa et al. | |
| 7,245,190 B2 * | 7/2007 | Copani | H03B 5/1231 331/117 R |

(Continued)

FOREIGN PATENT DOCUMENTS

EP     1852968 A1     11/2007

OTHER PUBLICATIONS

Kwok K., et al., "Ultra-Low-Voltage High-Performance CMOS VCOs Using Transformer Feedback," IEEE Journal of Solid-State Circuits, vol. 40 (3), Mar. 2005, pp. 652-660.

(Continued)

*Primary Examiner* — Arnold Kinkead
(74) *Attorney, Agent, or Firm* — Patterson & Sheridan, L.L.P.

(57) ABSTRACT

A transformer is described. The transformer includes a primary coil and a first secondary coil. A first coupling occurs between the first secondary coil and the primary coil. The transformer also includes a second secondary coil. A second coupling occurs between the second secondary coil and the primary coil. The first secondary coil is separated from the second secondary coil to prevent coupling between the first secondary coil and the second secondary coil. A first width of the first secondary coil is configured independently of a second width of the second secondary coil.

25 Claims, 7 Drawing Sheets

(56) References Cited

U.S. PATENT DOCUMENTS

| | | |
|---|---|---|
| 8,502,620 B2 | 8/2013 | Lu et al. |
| 8,665,033 B2 * | 3/2014 | Tang .................... H03B 5/1228 331/117 FE |
| 8,831,917 B2 * | 9/2014 | Wang et al. ........................ 703/2 |
| 2006/0082418 A1 | 4/2006 | Wood |
| 2007/0018740 A1 | 1/2007 | Gabara et al. |
| 2008/0284534 A1 | 11/2008 | El |
| 2010/0277250 A1 | 11/2010 | Aga et al. |
| 2011/0148536 A1 * | 6/2011 | Italia .................... H03B 5/1268 331/117 FE |
| 2011/0221530 A1 | 9/2011 | Sutardja et al. |
| 2013/0106553 A1 * | 5/2013 | Kim et al. ..................... 336/200 |
| 2013/0307630 A1 | 11/2013 | Ma et al. |

OTHER PUBLICATIONS

Yun S.J., et al., "Transformer-coupled voltage controlled oscillator," Asia-Pacific Microwave Conference, (APMC), 2008, pp. 1-4.
International Search Report and Written Opinion—PCT/US2015/01298—ISA/EPO—Apr. 10, 2015.

* cited by examiner

TRANSFORMER FEEDBACK VOLTAGE CONTROLLED OSCILLATOR (VCO)

TECHNICAL FIELD

The present disclosure relates generally to communication systems. More specifically, the present disclosure relates to systems and methods for a transformer feedback voltage controlled oscillator (VCO).

BACKGROUND

Wireless communication systems are widely deployed to provide various types of communication content such as voice, video, data and so on. These systems may be multiple-access systems capable of supporting simultaneous communication of multiple wireless communication devices with one or more base stations.

For proper reception and transmission of wireless signals on a wireless communication network, a wireless communication device may use one or more voltage controlled oscillators (VCO) to generate a signal with a desired frequency. Wireless communication device and/or wireless communication system specifications may require that the amplitude of the signal generated meets certain requirements while the signal also maintains high levels of reliability. In addition, a wireless communication device may operate using batteries. Therefore, a voltage controlled oscillator using less current is advantageous. Benefits may be realized by providing improvements to voltage controlled oscillators (VCOs) and improvements relating to voltage controlled oscillators (VCOs).

SUMMARY

A transformer is described. The transformer includes a primary coil and a first secondary coil. A first coupling occurs between the first secondary coil and the primary coil. The transformer also includes a second secondary coil. A second coupling occurs between the second secondary coil and the primary coil. The first secondary coil is separated from the second secondary coil to prevent coupling between the first secondary coil and the second secondary coil. A first width of the first secondary coil is configured independently of a second width of the second secondary coil.

A first turn ratio between the first secondary coil and the primary coil may be configured independently of a second turn ratio between the second secondary coil and the primary coil. The primary coil and the first secondary coil may form a first transformer. The primary coil and the second secondary coil may form a second transformer. The first transformer and the second transformer may form an asymmetric three coil transformer.

The first transformer may be used as transformer feedback for an n-type transistor. The second transformer may be used as transformer feedback for a p-type transistor. The asymmetric three coil transformer may be used in a complementary metal-oxide-semiconductor voltage controlled oscillator. The first secondary coil may be coupled between a source of a first PMOS transistor and a source of a second PMOS transistor. The primary coil may be coupled between a drain of the first PMOS transistor and a drain of the second PMOS transistor. The primary coil may also be coupled between a drain of a first NMOS transistor and a drain of a second NMOS transistor. The second secondary coil may be coupled between a source of the first NMOS transistor and a source of the second NMOS transistor.

A source voltage may be coupled between a first portion of the first secondary coil and a second portion of the first secondary coil. A ground node may be coupled between a first portion of the second secondary coil and a second portion of the second secondary coil. A gate of the first NMOS transistor may be coupled to the drain of the second NMOS transistor. A gate of the second NMOS transistor may be coupled to the drain of the first NMOS transistor. A gate of the first PMOS transistor may be coupled to the drain of the second PMOS transistor. A gate of the second PMOS transistor may be coupled to the drain of the first PMOS transistor.

A method for generating a voltage controlled oscillator is also described. A first configuration for a first transformer is optimized. A second configuration for a second transformer is also optimized. The voltage controlled oscillator is generated using transformer feedback with the first transformer and the second transformer. The first transformer and the second transformer form an asymmetric three coil transformer that includes a first secondary coil and a second secondary coil. A first width of the first secondary coil is configured independently of a second width of the second secondary coil.

The method may be performed by automated integrated circuit design software.

An apparatus for generating a voltage controlled oscillator is also described. The apparatus includes means for optimizing a first configuration for a first transformer. The apparatus also includes means for optimizing a second configuration for a second transformer. The apparatus further includes means for generating the voltage controlled oscillator using transformer feedback with the first transformer and the second transformer. The first transformer and the second transformer form an asymmetric three coil transformer that includes a first secondary coil and a second secondary coil. A first width of the first secondary coil is configured independently of a second width of the second secondary coil.

A computer-program product for generating a voltage controlled oscillator is described. The computer-program product includes a non-transitory computer-readable medium having instructions thereon. The instructions include code for causing a computer to optimize a first configuration for a first transformer. The instructions also include code for causing the computer to optimize a second configuration for a second transformer. The instructions further include code for causing the computer to generate the voltage controlled oscillator using transformer feedback with the first transformer and the second transformer. The first transformer and the second transformer form an asymmetric three coil transformer that includes a first secondary coil and a second secondary coil. A first width of the first secondary coil is configured independently of a second width of the second secondary coil.

DETAILED DESCRIPTION

Figure 1:
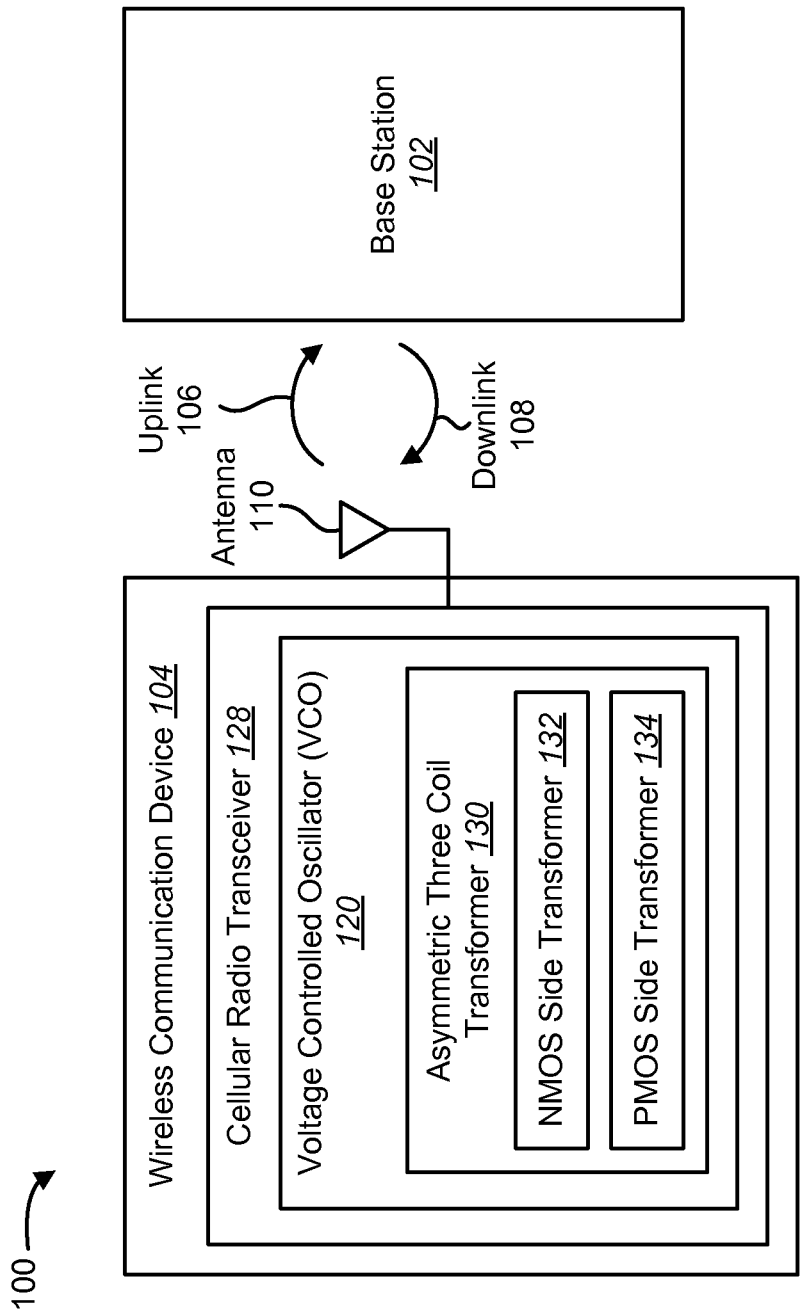
FIG. 1 shows a wireless communication system with multiple wireless devices.

FIG. 1 shows a wireless communication system 100 with multiple wireless devices. A wireless device may be a base station 102, a wireless communication device 104, or the like. The wireless communication device 104 may include one or more voltage controlled oscillators (VCOs) 120. A voltage controlled oscillator (VCO) 120 is an electric oscillator with an oscillation frequency that is controlled by an input voltage. Design changes to voltage controlled oscillators (VCOs) 120 may result in improved phase noise. For example, the wireless communication device 104 may include a complementary metal-oxide-semiconductor (CMOS) transformer feedback voltage controlled oscillator (VCO) 120 that includes an asymmetric three coil transformer 130, allowing for low phase-noise with minimal power consumption.

A wireless communication device 104 may also be referred to as, and may include some or all of the functionality of, a terminal, an access terminal, a user equipment (UE), a mobile device, a subscriber unit, a station, etc. A wireless communication device 104 may be a cellular phone, a personal digital assistant (PDA), a wireless device, a wireless modem, a handheld device, a laptop computer, etc. A wireless communication device 104 may communicate with zero, one, or multiple base stations 102 on the downlink 108 and/or uplink 106 at any given moment using an antenna 110. The downlink 108 (or forward link) refers to the communication link from a base station 102 to the wireless communication device 104, and the uplink 106 (or reverse link) refers to the communication link from the wireless communication device 104 to the base station 102.

A base station 102 is a station that communicates with one or more wireless communication devices 104. A base station 102 may also be referred to as, and may include some or all of the functionality of, an access point, a broadcast transmitter, a Node B, an evolved Node B, etc. Each base station 102 provides communication coverage for a particular geographic area. The term "cell" can refer to a base station 102 and/or its coverage area depending on the context in which the term is used.

Communications in a wireless communication system 100 (e.g., a multiple-access system) may be achieved through transmissions over a wireless link. Such a communication link may be established via a single-input and single-output (SISO), multiple-input and single-output (MISO) or a multiple-input and multiple-output (MIMO) system. A MIMO system includes transmitter(s) and receiver(s) equipped, respectively, with multiple ($N_T$) transmit antennas and multiple ($N_R$) receive antennas for data transmission. SISO and MISO systems are particular instances of a MIMO system. The MIMO system can provide improved performance (e.g., higher throughput, greater capacity or improved reliability) if the additional dimensionalities created by the multiple transmit and receive antennas are utilized.

The wireless communication system 100 may utilize MIMO. A MIMO system may support both time division duplex (TDD) and frequency division duplex (FDD) systems. In a TDD system, uplink and downlink transmissions are in the same frequency region so that the reciprocity principle allows the estimation of the downlink 108 from the uplink 106. This enables a transmitting wireless device to extract transmit beamforming gain from communications received by the transmitting wireless device.

The wireless communication system 100 may be a multiple-access system capable of supporting communication with multiple wireless communication devices 104 by sharing the available system resources (e.g., bandwidth and transmit power). Examples of such multiple-access systems include code division multiple access (CDMA) systems, wideband code division multiple access (W-CDMA) systems, time division multiple access (TDMA) systems, frequency division multiple access (FDMA) systems, orthogonal frequency division multiple access (OFDMA) systems, single-carrier frequency division multiple access (SC-FDMA) systems, $3^{rd}$ Generation Partnership Project (3GPP) Long Term Evolution (LTE) systems and spatial division multiple access (SDMA) systems.

The terms "networks" and "systems" are often used interchangeably. A CDMA network may implement a radio technology such as Universal Terrestrial Radio Access (UTRA), cdma2000, etc. UTRA includes W-CDMA and Low Chip Rate (LCR) while cdma2000 covers IS-2000, IS-95 and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16, IEEE 802.20, Flash-OFDMA, etc. UTRA, E-UTRA and GSM are part of Universal Mobile Telecommunication System (UMTS). Long Term Evolution (LTE) is a release of UMTS that uses E-UTRA. UTRA, E-UTRA, GSM, UMTS and Long Term Evolution (LTE) are described in documents from an organization named "3rd Generation Partnership Project" (3GPP). cdma2000 is described in documents from an organization named "3rd Generation Partnership Project 2" (3GPP2).

The $3^{rd}$ Generation Partnership Project (3GPP) is a collaboration between groups of telecommunications associations that aims to define a globally applicable $3^{rd}$ generation (3G) mobile phone specification. 3GPP Long Term Evolution (LTE) is a 3GPP project aimed at improving the Universal Mobile Telecommunications System (UMTS) mobile phone standard. The 3GPP may define specifications for the next generation of mobile networks, mobile systems and mobile devices. In 3GPP Long Term Evolution (LTE), a wireless communication device 104 may be referred to as a "user equipment" (UE).

The wireless communication device 104 may include a cellular radio transceiver 128. The cellular radio transceiver 128 may facilitate the sending and receiving of signals using an antenna 110. The cellular radio transceiver 128 is discussed in additional detail below in relation to FIG. 6. The cellular radio transceiver 128 may include one or more voltage controlled oscillators (VCO) 120. A voltage controlled oscillator (VCO) 120 may be used in function generators, phase locked loops, frequency synthesizers and as a clock generator.

A voltage controlled oscillator (VCO) 120 may be a p-type metal-oxide-semiconductor (PMOS) voltage controlled oscillator (VCO) 120, an n-type metal-oxide-semiconductor (NMOS) voltage controlled oscillator (VCO) 120 or a CMOS voltage controlled oscillator (VCO) 120, depending on the types of transistors used within the voltage controlled oscillator (VCO) 120. In general, a PMOS voltage controlled oscillator (VCO) 120 includes only PMOS transistors (also referred to as p-type transistors), an NMOS voltage controlled oscillator (VCO) 120 includes only NMOS transistors (also referred to as n-type transistors) and a CMOS voltage controlled oscillator (VCO) 120 includes both PMOS transistors and NMOS transistors. The voltage controlled oscillator (VCO) 120 used in the wireless communication device 104 may be a CMOS voltage controlled oscillator (VCO) 120 that includes both PMOS transistors and NMOS transistors.

The voltage controlled oscillator (VCO) 120 may include transformer feedback between a drain and a source of transistors within the voltage controlled oscillator (VCO) 120. Transformer feedback refers to the use of an integrated transformer in place of inductors to increase the voltage swing, improve the loaded quality factor (Q) and minimize the noise-to-phase-noise transfer. The voltage controlled oscillator (VCO) 120 may use an asymmetric three coil transformer 130 for the transformer feedback. The characteristics of a transformer are typically dictated by the turn ratio of the coils. In an asymmetric transformer, the physical dimensions of each coil (including width, length and thickness) may differ. The asymmetric three coil transformer 130 may include a PMOS side transformer 134 and an NMOS side transformer 132. Using both a PMOS side transformer 134 and an NMOS side transformer 132 may improve the phase noise of the voltage controlled oscillator (VCO) 120. However, a high-Q resonant tank may be needed within the voltage controlled oscillator (VCO) 120 for the transformer feedback scheme to work effectively.

For a CMOS voltage controlled oscillator (VCO) 120 with transformer feedback from both the PMOS transistor and the NMOS transistor, the quality factor (Q) of the main inductor (i.e., a primary coil) is decreased by the additional transformer coils (i.e., a first secondary coil and a second secondary coil). The optimization of the coupling factors may be intertwined with the inductance value, due to the coupling between the primary coil, the first secondary coil and the second secondary coil. To optimize the coupling factors and improve the quality factor (Q) of the main inductor in a CMOS voltage controlled oscillator (VCO) 120, independent optimizations (in terms of inductance and coupling factor) may be performed for the NMOS side transformer 132 and the PMOS side transformer 134. The magnetic field of the first secondary coil and the second secondary coil may be decoupled. A circuit diagram for the CMOS voltage controlled oscillator (VCO) 120 is given below in relation to FIG. 3.

Figure 2:
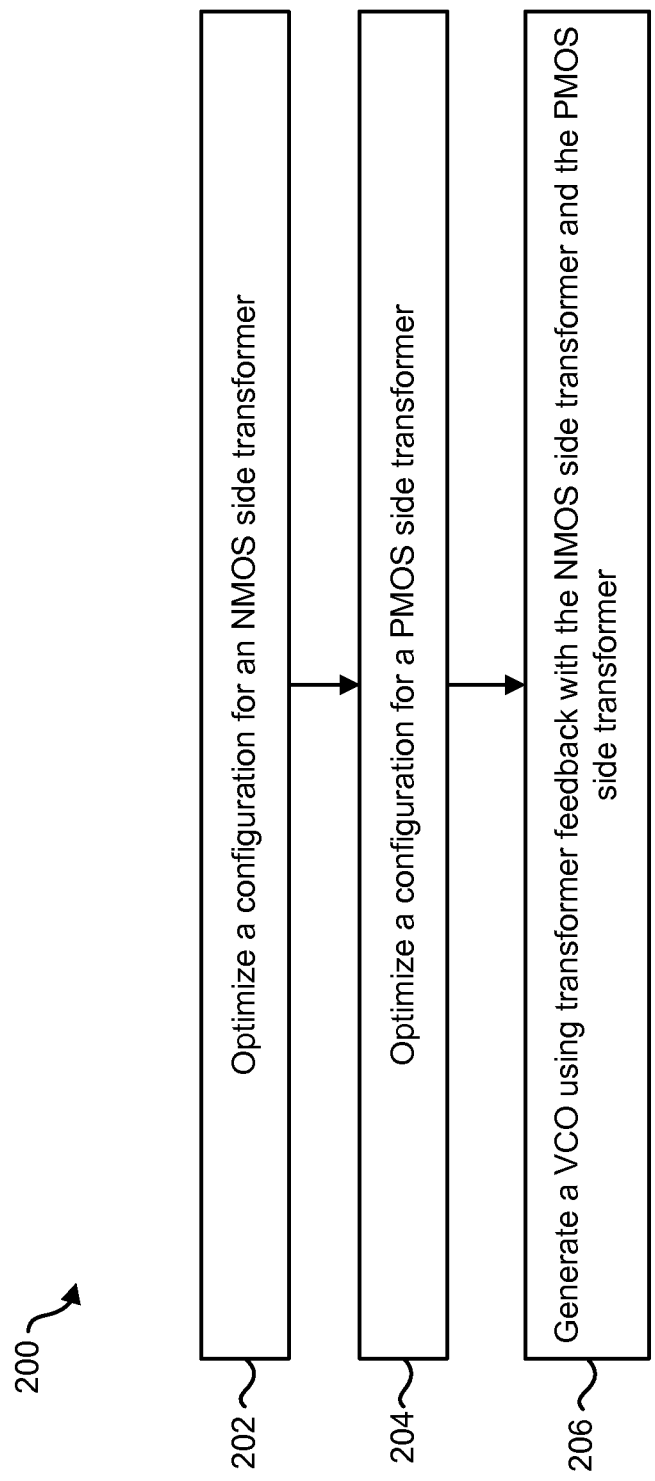
FIG. 2 is a flow diagram of a method for generating a CMOS voltage controlled oscillator (VCO)

FIG. 2 is a flow diagram of a method 200 for generating a CMOS voltage controlled oscillator (VCO) 120. The method 200 may be performed by an engineer (such as a design engineer) or by a computer (such as automated integrated circuit design software). A configuration for an NMOS side transformer 132 is optimized 202. The NMOS side transformer 132 may include a primary coil and a first secondary coil. A configuration for a PMOS side transformer 134 is also optimized 204. The PMOS side transformer 134 may include the primary coil and a second secondary coil. The first secondary coil may be magnetically decoupled from the second secondary coil. Thus, coupling may occur between the primary coil and the first secondary coil and between the primary coil and the second secondary coil but not between the first secondary coil and the second secondary coil. This allows the NMOS side transformer 132 and the PMOS side transformer 134 to be configured independently.

Optimizing a configuration for a transformer may include adjusting the inductance value of the coils in the transformer, adjusting the coupling factor between the coils in the transformer and/or adjusting the quality factor (Q) of the transformer. For example, the primary coil and the first secondary coil may use asymmetric widths (e.g., the primary coil may have a larger width than the first secondary coil) and/or spacing, allowing for the turn ratio and the coupling factor to be controlled. A voltage controlled oscillator (VCO) 120 may be generated 206 using transformer feedback with the NMOS side transformer 132 and the PMOS side transformer 134. The voltage controlled oscillator (VCO) 120 may be a CMOS transformer feedback voltage controlled oscillator (VCO) 120.

Figure 3:
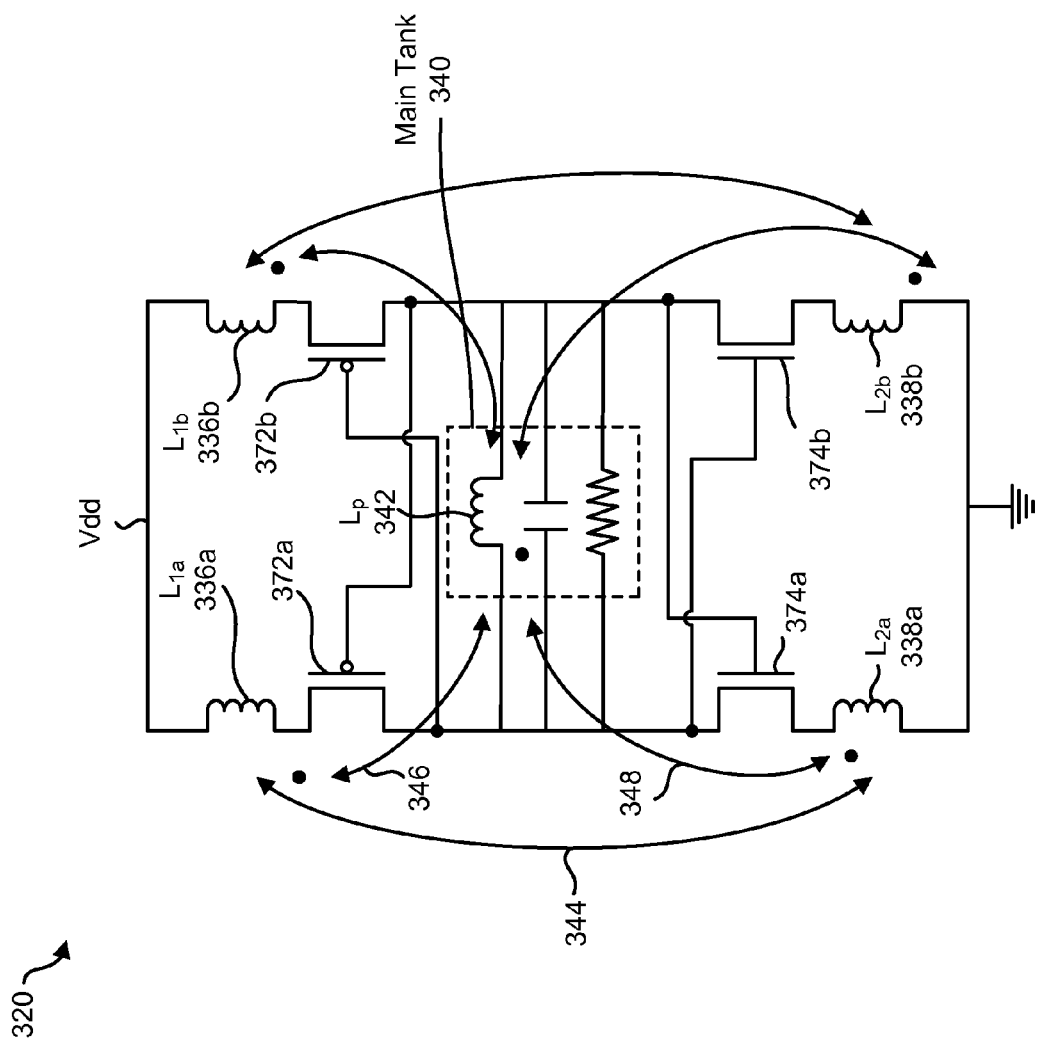
FIG. 3 is a circuit diagram of a CMOS voltage controlled oscillator (VCO) for use in the present systems and methods.
Figure 4:
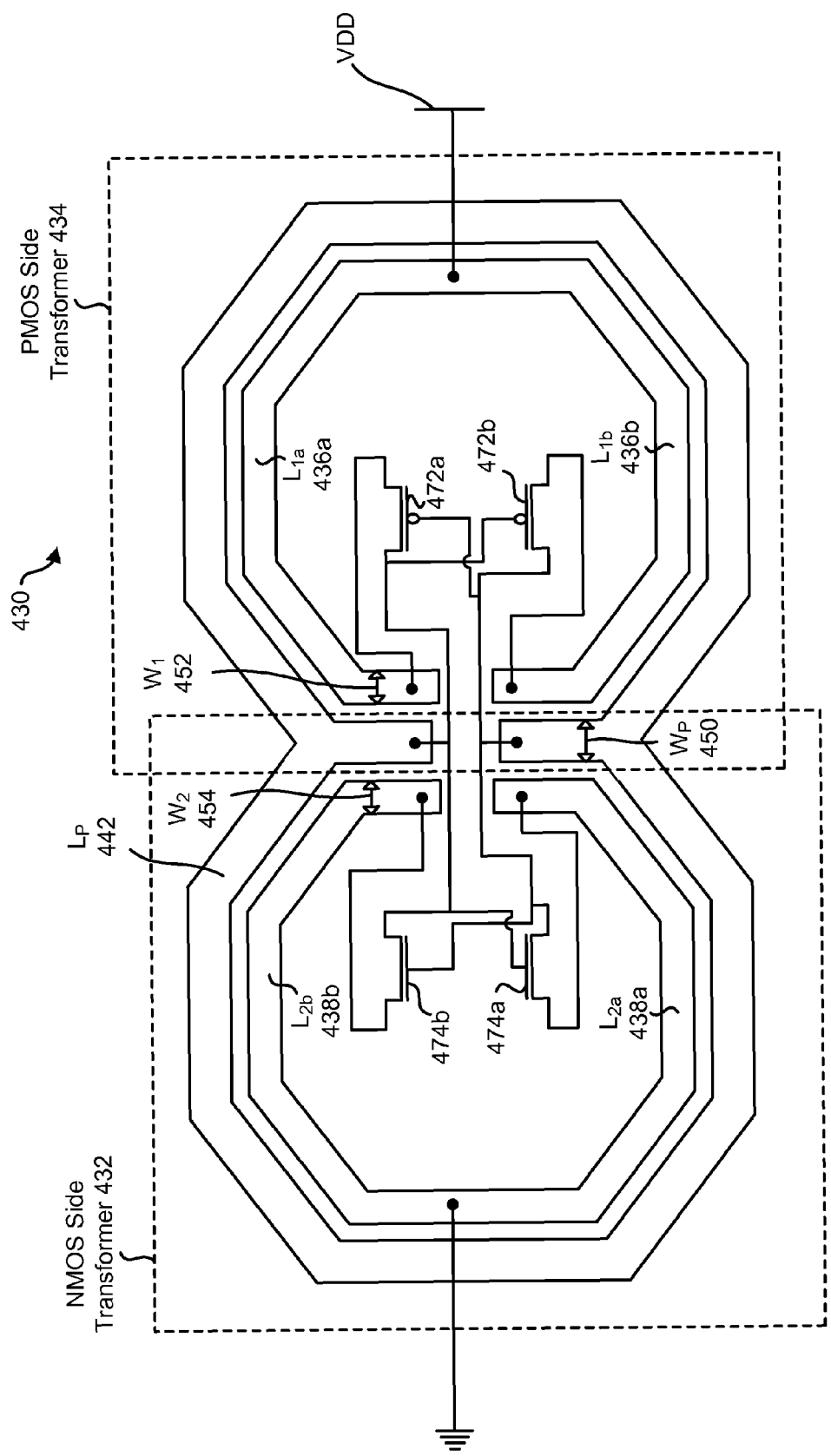
FIG. 4 illustrates a layout of an asymmetric three coil transformer.

FIG. 3 is a circuit diagram of a CMOS voltage controlled oscillator (VCO) 320 for use in the present systems and methods. The CMOS voltage controlled oscillator (VCO) 320 of FIG. 3 may be one configuration of the voltage controlled oscillator (VCO) 120 of FIG. 1. As illustrated in FIG. 4 below, L1$a$ 336$a$ and L1$b$ 336$b$ may be positioned in a layout in such a way to minimize coupling with L2$a$ 338$a$ and L2$b$ 338$b$. For example, a coupling 346 between L1$a$ 336$a$ and Lp 342 may be desired while a coupling 344 between L1$a$ 336$a$ and L2$a$ 338$a$ is minimized.

A VDD node (e.g., a source voltage) may be coupled between L1$a$ 336$a$ and L1$b$ 336$b$. L1$a$ 336$a$ may also be coupled to the source of a first PMOS transistor 372$a$. L1$b$ 336$b$ may also be coupled to the source of a second PMOS transistor 372$b$. The gate of the first PMOS transistor 372$a$ may be coupled to the drain of the second PMOS transistor 372$b$. The gate of the second PMOS transistor 372$b$ may be coupled to the drain of the first PMOS transistor 372$a$.

A ground node may be coupled between L2$a$ 338$a$ and L2$b$ 338$b$. L2$a$ 338$a$ may also be coupled to the source of a first NMOS transistor 374$a$. L2$b$ 338$b$ may also be coupled to the source of a second NMOS transistor 374$b$. The gate of the first NMOS transistor 374$a$ may be coupled to the drain of the second NMOS transistor 374$b$. Likewise, the gate of the second NMOS transistor 374$b$ may be coupled to the drain of the first NMOS transistor 374$a$. The drain of the first NMOS transistor 374$a$ may be coupled to the primary inductor Lp 342 and to the drain of the first PMOS transistor 372$a$. Likewise, the drain of the second NMOS transistor 374$b$ may be coupled to the primary inductor Lp 342 and to the drain of the second PMOS transistor 372$b$.

The primary inductor Lp 342 may be part of a main tank 340. The main tank 340 may include additional elements, such as capacitors and resistors.

The CMOS voltage controlled oscillator (VCO) 320 may use a feedback path between the drain and source of the negative-gm transistors using transformers (e.g., the PMOS side transformer 134 and the NMOS side transformer 132) to improve the voltage controlled oscillator (VCO) 120 phase noise. The CMOS voltage controlled oscillator (VCO) 320 may include a high-Q resonant main tank 340. By using an asymmetric three coil transformer 130 within the CMOS voltage controlled oscillator (VCO) 320, the NMOS side transformer 132 and the PMOS side transformer 134 may each be configured independently. The structure (e.g., a sample layout) of the asymmetric three coil transformer 130 is discussed in additional detail below in relation to FIG. 4 and FIG. 5.

FIG. 4 illustrates a layout of an asymmetric three coil transformer 430. The asymmetric three coil transformer 430 includes a primary coil Lp 442, a first secondary coil L1 436$a$-$b$ and a second secondary coil L2 438$a$-$b$. The design of the asymmetric three coil transformer 430 may improve the main tank 340 quality factor (Q). In addition, a decoupling of the first secondary coil L1 436 and the second secondary coil L2 438 (i.e., by separating the first secondary coil L1 436 and the second secondary coil L2 438 on the layout of an integrated circuit to reduce the coupling between the first secondary coil L1 436 and the second secondary coil L2 438) may enable independent optimization of the NMOS side transformer 432 and the PMOS side transformer 434. For example, the width W1 452 and turn ratio of the first secondary coil L1 436 may be configured independently of the width W2 454 and turn ratio of the second secondary coil L2 438 and the width Wp 450 and turn ratio of the primary coil Lp 442. As another example, the turn ratio between the first secondary coil L1 436 and the primary coil Lp 442 may be configured independently of the turn ratio between the second secondary coil L2 438 and the primary coil Lp 442. In yet another example, the spacing between the first secondary coil L1 436 and the primary coil Lp 442 may be configured independently from the spacing between the second secondary coil L2 438 and the primary coil Lp 442.

In the asymmetric three coil transformer 430 illustrated, the primary coil Lp 442 is wrapped around the outside of both the first secondary coil L1 436 and the second secondary coil L2 438. However, the first secondary coil L1 436 and the second secondary coil L2 438 are separated such that no magnetic coupling occurs between the first secondary coil L1 436 and the second secondary coil L2 438.

A ground node is coupled between L2a 438a and L2b 438b. L2a 438a is also coupled to the source of a first NMOS transistor 474a. L2b 438b is also coupled to the source of a second NMOS transistor 474b. The gate of the first NMOS transistor 474a may be coupled to the drain of the second NMOS transistor 474b. Likewise, the gate of the second NMOS transistor 474b may be coupled to the drain of the first NMOS transistor 474a. The drain of the first NMOS transistor 474a may be coupled to the primary coil Lp 442 and to the drain of a first PMOS transistor 472a. Likewise, the drain of the second NMOS transistor 474b may be coupled to the primary coil Lp 442 and to the drain of a second PMOS transistor 472b.

A VDD node may be coupled between L1a 436a and L1b 436b. L1a 436a may also be coupled to the source of the first PMOS transistor 472a. L1b 436b may also be coupled to the source of the second PMOS transistor 472b. The gate of the first PMOS transistor 472a may be coupled to the drain of the second PMOS transistor 472b. The gate of the second PMOS transistor 472b may be coupled to the drain of the first PMOS transistor 472a.

Figure 5:
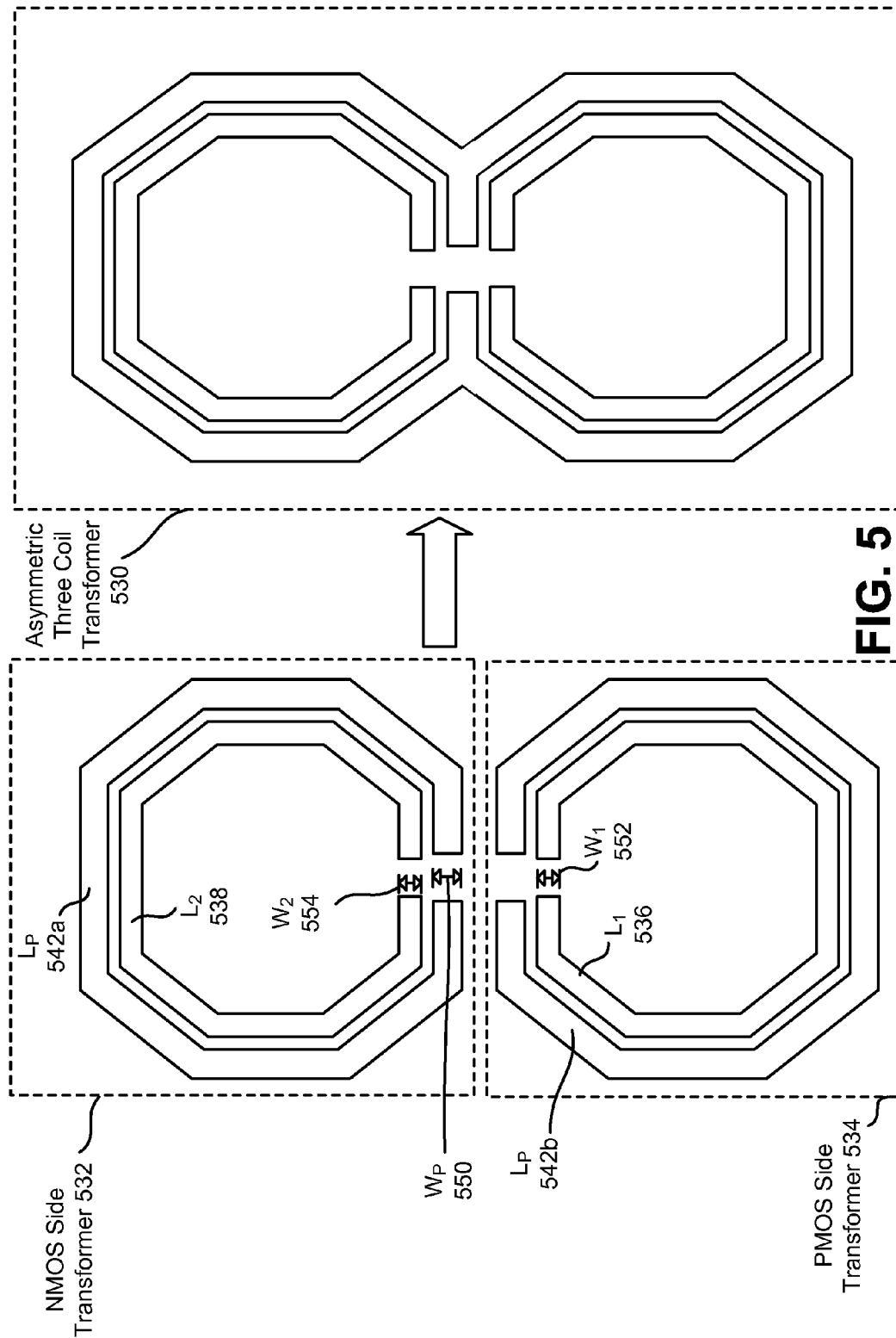
FIG. 5 illustrates the independent configuration of an NMOS side transformer and a PMOS side transformer to generate an asymmetric three coil transformer.

FIG. 5 illustrates the independent configuration of an NMOS side transformer 532 and a PMOS side transformer 534 to generate an asymmetric three coil transformer 530. The main inductance (e.g., from the primary inductor Lp 542a-b) of the resonator tank is a parallel structure of two branches: an NMOS side transformer 532 and a PMOS side transformer 534. By independently configuring the NMOS side transformer 532 and the PMOS side transformer 534, the quality factor of the primary inductor Lp 542 may be improved at high frequencies. The spacing/width/number of turns of the coils (such as the width W1 552 of the first secondary coil L1 536, the width W2 554 of the second secondary coil L2 538 and the width Wp 550 of the primary inductor Lp 542) may be independently adjusted to optimize the phase noise. The independently configured transformers may then be combined in a layout to form the asymmetric three coil transformer 530.

Figure 6:
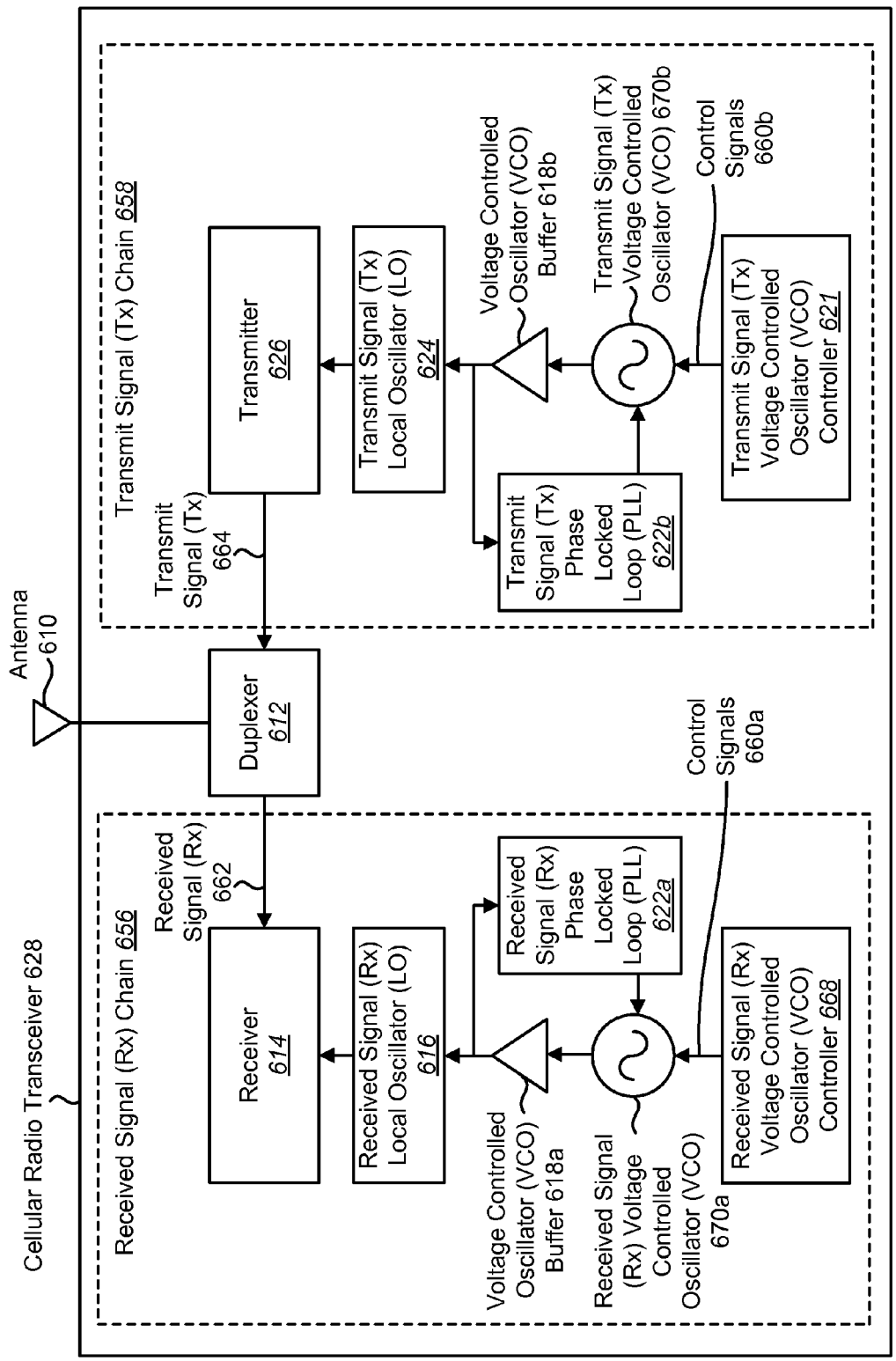
FIG. 6 is a block diagram illustrating a cellular radio transceiver.

FIG. 6 is a block diagram illustrating a cellular radio transceiver 628. The cellular radio transceiver 628 of FIG. 6 may be one configuration of the cellular radio transceiver 128 of FIG. 1. The cellular radio transceiver 628 may be included on a wireless communication device 104. The cellular radio transceiver 628 may be connected to an antenna 610. The antenna 610 may be used for sending and receiving wireless communications. The duplexer 612 may allow bi-directional communication over a single channel. In other words, the duplexer 612 may isolate the received signals (Rx) 662 from the transmit signals (Tx) 664.

Received signals (Rx) 662 may be sent through a duplexer 612 on the cellular radio transceiver 628 to a receive signal (Rx) chain 656. The received signal (Rx) chain 656 may include a receiver 614. To properly receive and decode received signals (RX) 662 by the receiver 614, the received signal (Rx) chain 656 may include a received signal (Rx) local oscillator (LO) 616. The received signal (Rx) local oscillator (LO) 616 may oscillate at the frequency of the received signal (Rx) 662. The frequency of the received signal (Rx) local oscillator (LO) 616 may be generated by a received signal (Rx) voltage controlled oscillator (VCO) 670a with a voltage controlled oscillator (VCO) buffer 618a and a received signal (Rx) phase locked loop (PLL) 622a. The received signal (Rx) phase locked loop (PLL) 622a may be a control system that generates a signal having a fixed relation to the phase of a reference signal. Voltage controlled oscillators (VCOs) 670 and voltage controlled oscillator (VCO) buffers 618 are discussed in further detail below in relation to FIGS. 3-8.

The received signal (Rx) chain 656 may include a received signal (Rx) voltage controlled oscillator (VCO) controller 668. The received signal (Rx) voltage controlled oscillator (VCO) controller 668 may be used to control the received signal (Rx) voltage controlled oscillator (VCO) 670a. For example, the received signal (Rx) voltage controlled oscillator (VCO) controller 668 may adjust the frequency generated by the received signal (Rx) voltage controlled oscillator (VCO) 670a as appropriate using control signals 660a. The received signal (Rx) voltage controlled oscillator (VCO) controller 668 may adjust the frequency generated by the received signal (Rx) voltage controlled oscillator (VCO) 670a to fine tune the received signal (Rx) voltage controlled oscillator (VCO) 670a or to move to a new frequency for a new wireless communication system 100.

The cellular radio transceiver 628 may prepare transmit signals (Tx) 664 for transmission using a transmit signal (Tx) chain 658. The transmit signal (Tx) chain 658 may include a transmitter 626. Transmit signals (Tx) 664 may be output by the transmitter 626 to the duplexer 612. To properly encode and transmit the transmit signals (Tx) 664, the transmit signal (Tx) chain 658 may include a transmit signal (Tx) local oscillator (LO) 624. The transmit signal (Tx) local oscillator (LO) 624 may oscillate at the frequency of transmission. In one configuration, the transmit signal (Tx) local oscillator (LO) 624 may oscillate at the frequency generated by a transmit signal (Tx) voltage controlled oscillator (VCO) 670b with a voltage controlled oscillator (VCO) buffer 618b and a transmit signal (Tx) phase locked loop (PLL) 622b. The transmit signal (Tx) phase locked loop (PLL) 622b may be a control system that generates a signal having a fixed relation to the phase of a reference signal.

The transmit signal (Tx) chain 658 may include a transmit signal (Tx) voltage controlled oscillator (VCO) controller 621. The transmit signal (Tx) voltage controlled oscillator (VCO) controller 621 may be used to control the transmit signal (Tx) voltage controlled oscillator (VCO) 670b. For example, the transmit signal (Tx) voltage controlled oscillator (VCO) controller 621 may adjust the frequency generated by the transmit signal (Tx) voltage controlled oscillator (VCO) 670b as appropriate using control signals 660b. The transmit signal (Tx) voltage controlled oscillator (VCO) controller 621 may adjust the frequency generated by the transmit signal (Tx) voltage controlled oscillator (VCO) 670b to fine tune the transmit signal (Tx) voltage controlled oscillator (VCO) 670b or to move to a new frequency for a new wireless communication system 100.

Figure 7:
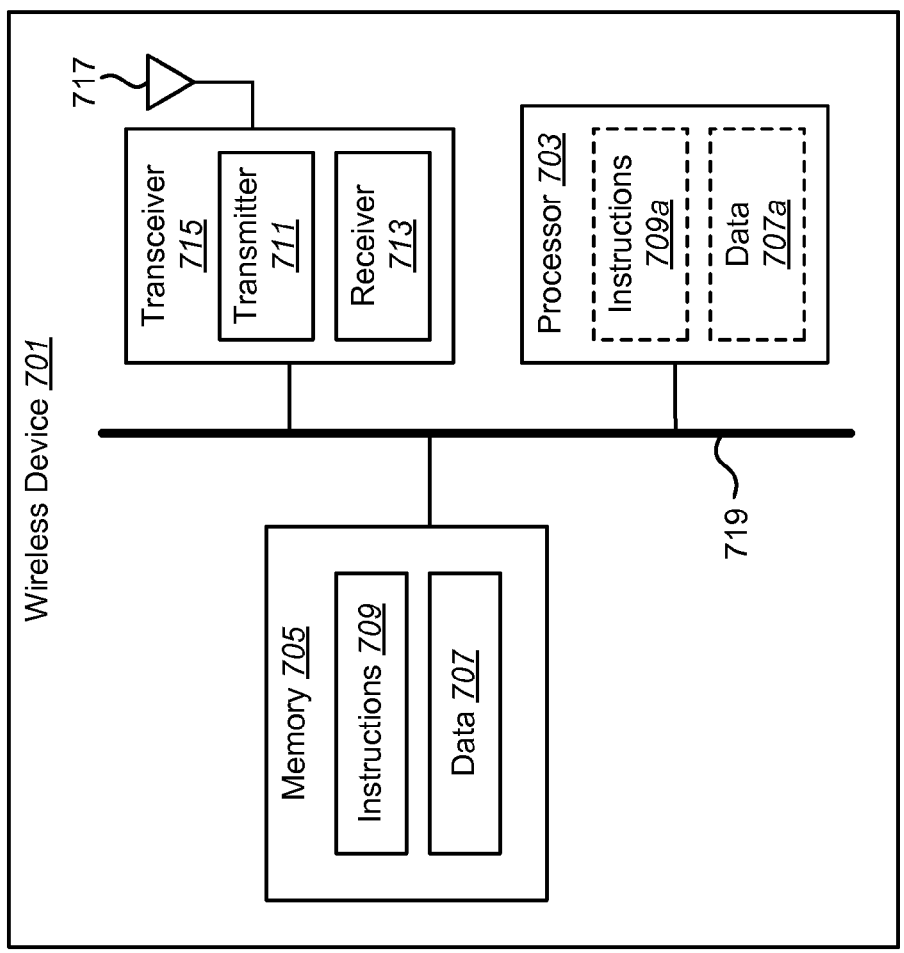
FIG. 7 illustrates certain components that may be included within a wireless device that is configured in accordance with the present disclosure.

FIG. 7 illustrates certain components that may be included within a wireless device 701. The wireless device 701 may be a wireless communication device 104 and may implement the present systems and methods as disclosed herein.

The wireless device 701 includes a processor 703. The processor 703 may be a general purpose single- or multi-chip microprocessor (e.g., an ARM), a special purpose microprocessor (e.g., a digital signal processor (DSP)), a microcontroller, a programmable gate array, etc. The processor 703 may be referred to as a central processing unit (CPU). Although just a single processor 703 is shown in the wireless device 701 of FIG. 7, in an alternative configuration, a combination of processors (e.g., an ARM and DSP) could be used.

The wireless device 701 also includes memory 705. The memory 705 may be any electronic component capable of storing electronic information. The memory 705 may be embodied as random access memory (RAM), read only memory (ROM), magnetic disk storage media, optical storage media, flash memory devices in RAM, on-board memory included with the processor, EPROM memory, EEPROM memory, registers and so forth, including combinations thereof.

Data 707 and instructions 709 may be stored in the memory 705. The instructions 709 may be executable by the processor 703 to implement the methods disclosed herein. Executing the instructions 709 may involve the use of the data 707 that is stored in the memory 705. When the processor 703 executes the instructions 709, various portions of the instructions 709a may be loaded onto the processor 703, and various pieces of data 707a may be loaded onto the processor 703.

The wireless device 701 may also include a transmitter 711 and a receiver 713 to allow transmission and reception of signals to and from the wireless device 701. The transmitter 711 and receiver 713 may be collectively referred to as a transceiver 715. An antenna 717 may be electrically coupled to the transceiver 715. The wireless device 701 may also include multiple transmitters, multiple receivers, multiple transceivers and/or multiple antennas (not shown).

The various components of the wireless device 701 may be coupled together by one or more buses, which may include a power bus, a control signal bus, a status signal bus, a data bus, etc. For the sake of clarity, the various buses are illustrated in FIG. 7 as a bus system 719.

In the above description, reference numbers have sometimes been used in connection with various terms. Where a term is used in connection with a reference number, this may be meant to refer to a specific element that is shown in one or more of the Figures. Where a term is used without a reference number, this may be meant to refer generally to the term without limitation to any particular Figure.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The functions described herein may be stored as one or more instructions on a processor-readable or computer-readable medium. The term "computer-readable medium" refers to any available medium that can be accessed by a computer or processor. By way of example, and not limitation, such a medium may comprise RAM, ROM, EEPROM, flash memory, CD-ROM or other optical disk storage, magnetic disk storage or other magnetic storage devices, or any other medium that can be used to store desired program code in the form of instructions or data structures and that can be accessed by a computer or processor. Disk and disc, as used herein, include compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL) or wireless technologies such as infrared, radio and microwave, then the coaxial cable, fiber optic cable, twisted pair, DSL or wireless technologies such as infrared, radio and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the systems, methods and apparatus described herein without departing from the scope of the claims.

No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A transformer, comprising:
   a primary coil;
   a first secondary coil, wherein a first coupling occurs between the first secondary coil and the primary coil; and
   a second secondary coil, wherein a second coupling occurs between the second secondary coil and the primary coil, and wherein the first secondary coil is separated from the second secondary coil to prevent coupling between the first secondary coil and the second secondary coil, wherein the first secondary coil is coupled between a source of a first p-type metal oxide-semiconductor (PMOS) transistor and a source of a second PMOS transistor, wherein the primary coil is coupled between a drain of the first PMOS transistor and a drain of the second PMOS transistor, wherein the primary coil is also coupled between a drain of a first n-type metal-oxide-semiconductor (NMOS) transistor and a drain of a second NMOS transistor, and wherein the second secondary coil is coupled between a source of the first NMOS transistor and a source of the second NMOS transistor.

2. The transformer of claim 1, wherein a first turn ratio between the first secondary coil and the primary coil is different from a second turn ratio between the second secondary coil and the primary coil.

3. The transformer of claim 1, wherein the transformer comprises an asymmetric three coil transformer.

4. The transformer of claim 3, wherein the primary coil and the first secondary coil are configured to provide transformer feedback for an n-type metal-oxide-semiconductor (NMOS) transistor, and wherein the primary coil and the second secondary coil are configured to provide transformer feedback for a p-type metal-oxide-semiconductor (PMOS) transistor.

5. The transformer of claim 4, wherein the asymmetric three coil transformer is part of a complementary metal-oxide-semiconductor voltage controlled oscillator.

6. The transformer of claim 1, wherein a source node is coupled between a first portion of the first secondary coil and a second portion of the first secondary coil.

7. The transformer of claim 1, wherein a ground node is coupled between a first portion of the second secondary coil and a second portion of the second secondary coil.

8. The transformer of claim 1, wherein a gate of the first NMOS transistor is coupled to the drain of the second NMOS transistor, and wherein a gate of the second NMOS transistor is coupled to the drain of the first NMOS transistor.

9. The transformer of claim 1, wherein a gate of the first PMOS transistor is coupled to the drain of the second PMOS transistor, and wherein a gate of the second PMOS transistor is coupled to the drain of the first PMOS transistor.

10. A method for generating a configuration for a voltage controlled oscillator, comprising:
generating a first configuration for a first transformer;
generating a second configuration for a second transformer; and
generating the configuration for the voltage controlled oscillator, wherein the voltage controlled oscillator is adapted to use transformer feedback with the first transformer and the second transformer, and wherein the first configuration for the first transformer and the second configuration for the second transformer form an asymmetric three coil transformer comprising a first secondary coil coupled to a primary coil and a second secondary coil coupled to the primary coil, wherein the first secondary coil and the second secondary coil are disposed inside a loop of the primary coil, and wherein the first secondary coil and the second secondary coil are separated by a conductive strip of the primary coil.

11. A voltage-controlled oscillator (VCO), comprising:
a transformer comprising a primary coil, a first secondary coil, and a second secondary coil, wherein a first coupling occurs between the first secondary coil and the primary coil, wherein a second coupling occurs between the second secondary coil and the primary coil, and wherein the first secondary coil is separated from the second secondary coil to prevent coupling between the first secondary coil and the second secondary coil; and
a tank circuit configured to generate an oscillating signal, wherein the tank circuit comprises the primary coil of the transformer, wherein the first secondary coil and the second secondary coil are disposed inside a loop of the primary coil, and wherein the first secondary coil and the second secondary coil are separated by a conductive strip of the primary coil.

12. The VCO of claim 11, wherein a first turn ratio between the first secondary coil and the primary coil is different from a second turn ratio between the second secondary coil and the primary coil.

13. The VCO of claim 11, wherein the transformer comprises an asymmetric three coil transformer.

14. The VCO of claim 11, wherein the VCO comprises an n-type metal-oxide-semiconductor (NMOS) transistor and a p-type metal-oxide-semiconductor (PMOS) transistor, wherein the primary coil and the first secondary coil are configured to provide transformer feedback for the NMOS transistor, and wherein the primary coil and the second secondary coil are configured to provide transformer feedback for the PMOS transistor.

15. The VCO of claim 11, wherein the VCO comprises a complementary metal-oxide-semiconductor (CMOS) VCO.

16. The VCO of claim 11, further comprising a first p-type metal-oxide-semiconductor (PMOS) transistor, a second PMOS transistor, a first n-type metal-oxide-semiconductor (NMOS) transistor, and a second NMOS transistor, wherein the first secondary coil is coupled between a source of the first PMOS transistor and a source of the second PMOS transistor, wherein the primary coil is coupled between a drain of the first PMOS transistor and a drain of the second PMOS transistor, wherein the primary coil is also coupled between a drain of the first NMOS transistor and a drain of the second NMOS transistor, and wherein the second secondary coil is coupled between a source of the first NMOS transistor and a source of the second NMOS transistor.

17. The VCO of claim 16, wherein a source node is coupled between a first portion of the first secondary coil and a second portion of the first secondary coil.

18. The VCO of claim 16, wherein a ground node is coupled between a first portion of the second secondary coil and a second portion of the second secondary coil.

19. The VCO of claim 16, wherein a gate of the first NMOS transistor is coupled to the drain of the second NMOS transistor, and wherein a gate of the second NMOS transistor is coupled to the drain of the first NMOS transistor.

20. The VCO of claim 16, wherein a gate of the first PMOS transistor is coupled to the drain of the second PMOS transistor, and wherein a gate of the second PMOS transistor is coupled to the drain of the first PMOS transistor.

21. The VCO of claim 11, wherein a first width of the first secondary coil is different from a second width of the second secondary coil.

22. The VCO of claim 11, wherein a first spacing between the first secondary coil and the primary coil is different from a second spacing between the second secondary coil and the primary coil.

23. The transformer of claim 1, wherein the first secondary coil and the second secondary coil are disposed inside a loop of the primary coil, and wherein the first secondary coil and the second secondary coil are separated by a conductive strip of the primary coil.

24. The transformer of claim 1, wherein a first width of the first secondary coil is different from a second width of the second secondary coil.

25. The transformer of claim 1, wherein a first spacing between the first secondary coil and the primary coil is different from a second spacing between the second secondary coil and the primary coil.

* * * * *